United States Patent
Smith et al.

(10) Patent No.: US 10,796,826 B2
(45) Date of Patent: *Oct. 6, 2020

(54) RESISTOR WITH TEMPERATURE COEFFICIENT OF RESISTANCE (TCR) COMPENSATION

(71) Applicant: VISHAY DALE ELECTRONICS, LLC, Columbus, NE (US)

(72) Inventors: Clark L. Smith, Columbus, NE (US); Thomas L. Bertsch, Norfolk, NE (US); Todd L. Wyatt, Columbus, NE (US); Thomas L. Veik, Columbus, NE (US)

(73) Assignee: VISHAY DALE ELECTRONICS, LLC, Columbus, NE (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,592

(22) Filed: Feb. 25, 2019

(65) Prior Publication Data

US 2019/0326038 A1    Oct. 24, 2019

Related U.S. Application Data

(63) Continuation of application No. 15/722,536, filed on Oct. 2, 2017, now Pat. No. 10,217,550, which is a
(Continued)

(51) Int. Cl.
*H01C 7/06* (2006.01)
*H01C 1/148* (2006.01)
(Continued)

(52) U.S. Cl.
CPC ............... *H01C 7/06* (2013.01); *G01R 1/203* (2013.01); *G01R 19/0092* (2013.01);
(Continued)

(58) Field of Classification Search
CPC ........ H01C 7/06; H01C 1/148; H01C 17/232; G01R 19/203; G01R 19/32
See application file for complete search history.

(56) References Cited

U.S. PATENT DOCUMENTS

| | | |
|---|---|---|
| 4,079,349 A | 3/1978 | Dorfeld |
| 4,200,970 A | 5/1980 | Schonberger |

(Continued)

FOREIGN PATENT DOCUMENTS

| | | |
|---|---|---|
| CN | 2490589 Y | 5/2002 |
| EP | 1313109 A2 | 5/2003 |

(Continued)

OTHER PUBLICATIONS

Isabellenhütte, ISA-PLAN®—Präzisionswiderstände/precision resistors, Typ/type PMU, Issue: May 1999, 3 pages.
(Continued)

*Primary Examiner* — Kyung S Lee
(74) *Attorney, Agent, or Firm* — Volpe and Koenig, P.C.

(57) ABSTRACT

A current sense resistor and a method of manufacturing a current sensing resistor with temperature coefficient of resistance (TCR) compensation are disclosed. The resistor has a resistive strip disposed between two conductive strips. A pair of main terminals and a pair of voltage sense terminals are formed in the conductive strips. A pair of rough TCR calibration slots is located between the main terminals and the voltage sense terminals, each of the rough TCR calibration slots have a depth selected to obtain a negative starting TCR value observed at the voltage sense terminals. A fine TCR calibration slot is formed between the pair of voltage sense terminals.

20 Claims, 4 Drawing Sheets

Related U.S. Application Data continuation of application No. 15/218,219, filed on Jul. 25, 2016, now Pat. No. 9,779,860, which is a continuation of application No. 14/531,505, filed on Nov. 3, 2014, now Pat. No. 9,400,294, which is a continuation of application No. 14/015,488, filed on Aug. 30, 2013, now Pat. No. 8,878,643, which is a continuation of application No. 13/493,402, filed on Jun. 11, 2012, now Pat. No. 8,525,637, which is a continuation of application No. 12/874,514, filed on Sep. 2, 2010, now Pat. No. 8,198,977.

(60) Provisional application No. 61/359,000, filed on Jun. 28, 2010, provisional application No. 61/239,962, filed on Sep. 4, 2009.

(51) Int. Cl.

| | | |
|---|---|---|
| *H01C 17/232* | (2006.01) | |
| *G01R 1/20* | (2006.01) | |
| *H01C 1/00* | (2006.01) | |
| *H01C 17/28* | (2006.01) | |
| *G01R 19/00* | (2006.01) | |
| *G01R 19/32* | (2006.01) | |

(52) U.S. Cl.
CPC .............. *G01R 19/32* (2013.01); *H01C 1/00* (2013.01); *H01C 1/148* (2013.01); *H01C 17/232* (2013.01); *H01C 17/28* (2013.01); *Y10T 29/49082* (2015.01); *Y10T 29/49101* (2015.01)

(56) References Cited

U.S. PATENT DOCUMENTS

| | | | |
|---|---|---|---|
| 4,529,958 A | 7/1985 | Person et al. | |
| 4,620,365 A | 11/1986 | Burger et al. | |
| 4,907,341 A | 3/1990 | Chapel, Jr. et al. | |
| 5,015,989 A | 5/1991 | Wohlfarth et al. | |
| 5,287,083 A | 2/1994 | Person et al. | |
| 5,604,477 A | 2/1997 | Rainer et al. | |
| 5,621,240 A | 4/1997 | Ellis | |
| 5,815,065 A | 9/1998 | Hanamura | |
| 5,953,811 A | 9/1999 | Mazzochette | |
| 5,999,085 A | 12/1999 | Szwarc et al. | |
| 6,097,276 A | 8/2000 | Van Den Broek et al. | |
| 6,150,920 A | 11/2000 | Hashimoto et al. | |
| 6,189,767 B1 | 2/2001 | Haspeslagh | |
| 6,348,392 B1 | 2/2002 | Nakayama et al. | |
| 6,356,179 B1 | 3/2002 | Yamada | |
| 6,401,329 B1 | 6/2002 | Smejkal et al. | |
| 6,492,896 B2 | 12/2002 | Yoneda | |
| 6,646,430 B1 | 11/2003 | Skerritt et al. | |
| RE39,660 E | 5/2007 | Szwarc et al. | |
| 7,380,333 B2 | 6/2008 | Tsukada et al. | |
| 7,843,309 B2 | 11/2010 | Zandman et al. | |
| 8,031,043 B2 | 10/2011 | Schultz et al. | |
| 8,183,976 B2 | 5/2012 | Lo et al. | |
| 8,198,977 B2 | 6/2012 | Smith et al. | |
| 8,242,878 B2 | 8/2012 | Smith et al. | |
| 8,525,637 B2 | 9/2013 | Smith et al. | |
| 8,581,687 B2 | 11/2013 | Belman | |
| 8,884,733 B2* | 11/2014 | Hetzler | G01R 1/203 338/7 |
| 9,396,849 B1 | 7/2016 | Wyatt et al. | |
| 9,779,860 B2* | 10/2017 | Smith | H01C 1/148 |
| 10,217,550 B2* | 2/2019 | Smith | H01C 1/148 |
| 2002/0031860 A1 | 3/2002 | Tanimura | |
| 2002/0130761 A1 | 9/2002 | Tsukada | |
| 2004/0216303 A1* | 11/2004 | Berlin | H01C 7/003 29/610.1 |
| 2004/0263150 A1 | 12/2004 | Hetzler | |
| 2005/0200451 A1 | 9/2005 | Tsukada | |
| 2009/0195348 A1 | 8/2009 | Smith et al. | |
| 2009/0205196 A1 | 8/2009 | Grudin et al. | |
| 2012/0154104 A1* | 6/2012 | Hetzler | G01R 1/203 338/49 |

FOREIGN PATENT DOCUMENTS

| | | |
|---|---|---|
| FR | 2 529 374 A1 | 12/1983 |
| JP | S57-117204 A | 7/1982 |
| JP | H02-110903 A | 4/1990 |
| JP | 03-025994 A | 2/1991 |
| JP | 05-006801 A | 1/1993 |
| JP | 6-267707 A | 9/1994 |
| JP | 11-283802 A | 10/1999 |
| JP | 2000-269012 A | 9/2000 |
| JP | 2001-155902 A | 6/2001 |
| JP | 2002-050501 A | 2/2002 |
| JP | 2003197403 A | 7/2003 |
| JP | 2004-047603 A | 2/2004 |
| JP | 2005-181056 A | 7/2005 |
| JP | 2006-112868 A | 4/2006 |
| JP | 2007-221006 A | 8/2007 |
| JP | 2007329421 A | 12/2007 |
| JP | 2009-141171 A | 6/2009 |
| WO | 00/00833 A1 | 1/2000 |
| WO | 2008/039208 A1 | 4/2008 |

OTHER PUBLICATIONS

Isabellenhütte, ISA-WELD®—SMD Präzisionswiderstände/SMD precision resistors, Technical Data, Issue BVB-Feb. 5, 2008, 4 pages.

Isabellenhütte, ISA-PLAN®-ISA-WELD®-technology: Precision and power resistors for highest requirements, The mΩ-concept, Issue May 2007, 6 pages.

Isabellenhütte, ISA-WELD® Precision and power resistors, Optimized shunts for energy metering market, Issue Oct. 2008, 2 pages.

Isabellenhütte, ISA-PLAN®—Präzisionswiderstände precision resistors, Typ/type BVR, Technical Data, Issue : Jan. 1, 2004, 3 pages.

Isabellenhütte, ISA-WELD® Precision and power resistors made of composite materials, SMD-Shunts for high current applications, Issue May 2005, 2 pages.

Power Electronics Europe, Inverter Design "Shunt Current Measuring up to 800A in the Inverter," Issue Jul. 2009, 4 pages.

Isabellenhütte, designed for high power, electronica 2004, Munich, Germany (Nov. 9-12), 5 pages.

Declaration Under 37 CFR 1.131 of Ullrich Hetzler, filed in U.S. Appl. No. 13/819,020, dated Jul. 10, 2014, 4 pages.

Isabellenhütte, ISA-PLAN®—SMD precision resistors, Technical Data, Issue PMB-Dec. 12, 2005, 4 pages.

Isabellenhütte, ISA-WELD®—SMD Präzisionswiderstände/SMD precision resistors, Technical Data, Issue BVO-Oct. 22, 2008, 4 pages.

Isabellenhütte, ISA-PLAN®—SMD Präazisionswiderstände/SMD precision resistors, Technical Data, Issue PMU-May 8, 2009, 4 pages.

Isabellenhütte Resistors Selection Guide, Issue Apr. 2009, 10 pages.

Isabellenhütte, ISA-WELD®—SMD Präzisionswiderstände/SMD precision resistors, Technical Data, Issue BVR-Jul. 11, 2005, 4 pages.

Isabellenhütte, ISA-WELD®—SMD Präzisionswiderstände/SMD precision resistors, Technical Data, Issue BVR-Feb. 5, 2008, 4 pages.

Isabellenhütte, ISA-WELD®—SMD Präzisionswiderstände/SMD precision resistors, Technical Data, Issue BVR-Feb. 17, 2009, 4 pages.

Isabellenhütte "designed for high power" Technical Data (www.isabellenhuette.de) 5 pages.

Bodo's Power System, IGBT Modules, May 2009, p. 39 (www.bodospower.com).

Bodo's Power System, News, Jul. 2009, p. 7 (www.bodospower.com).

(56) References Cited

OTHER PUBLICATIONS

Göpfrich et al., "Shunt Current Measuring up to 800A in the Inverter," Inverter Design published by Power Electronics Europe, Issue Jul. 2009, pp. 20 and 21 (www.isabellenhuette.de).

* cited by examiner

RESISTOR WITH TEMPERATURE COEFFICIENT OF RESISTANCE (TCR) COMPENSATION

CROSS REFERENCE TO RELATED APPLICATIONS

This application is a continuation of U.S. patent application Ser. No. 15/722,536, filed Oct. 2, 2017, which is a continuation of U.S. patent application Ser. No. 15/218,219, filed Jul. 25, 2016, which issued as U.S. Pat. No. 9,779,860 on Oct. 3, 2017, which is a continuation of U.S. patent application Ser. No. 14/531,505, filed Nov. 3, 2014, issued as U.S. Pat. No. 9,400,294 on Jul. 26, 2016, which is a continuation of U.S. patent application Ser. No. 14/015,488, filed Aug. 30, 2013, issued as U.S. Pat. No. 8,878,643 on Nov. 4, 2014, which is a continuation of U.S. patent application Ser. No. 13/493,402, filed Jun. 11, 2012, issued as U.S. Pat. No. 8,525,637 on Sep. 3, 2013, which is a continuation of U.S. patent application Ser. No. 12/874,514, filed Sep. 2, 2010, issued as U.S. Pat. No. 8,198,977 on Jun. 12, 2012, which claims the benefit of U.S. Provisional Application No. 61/359,000, filed Jun. 28, 2010, and U.S. Provisional Application No. 61/239,962, filed Sep. 4, 2009, the entire contents of all of which are hereby incorporated by reference as if fully set forth herein.

FIELD OF THE INVENTION

The present invention relates to a four terminal current sense resistor of very low ohmic value and high stability.

BACKGROUND

Surface mounted current sense resistors have been available for the electronic market for many years. Their construction typically includes a flat strip of a resistive material that is coupled between high conductivity metal terminals forming the main terminals of the device. A pair of voltage sense terminals can be formed in the main terminals thereby creating a four terminal device. The main terminals carry the majority of the current through the device. The voltage sense terminals produce a voltage that is proportional to the current passing through the device. Such devices provide a mechanism to monitor the current passing through a given circuit using conventional voltage sensing techniques. The actual current passing through the device can be determined based on the sensed voltage and the resistance value of the device as dictated by ohms law. An ideal device would have a Temperature Coefficient of Resistance (TCR) that is close to zero. However, most devices have a non-zero TCR that can lead to inaccurate voltage readings at the voltage sense terminals particularly when the temperature of the device varies.

In low ohmic current sense resistors and high current shunts, the resistive element length is short while the length of the resistor is a standard length, or in the case of high current shunts long because of the application. The long resistor length and short resistive element length causes a significant amount of copper termination metal to be in the current path. Copper has a TCR of 3900 ppm/° C. while the resistive material is typically less than 100 ppm/° C. The added copper in the current path drives the overall TCR of the resistor to values that can be in the 800 ppm/° C. range or greater, versus a desired TCR of less than 100 ppm/° C.

As noted above, typical current sense resistors have four terminals, two main terminals and two voltage sense terminals, separated by two slots. The length of two slots is manipulated to adjust TCR. See U.S. Pat. No. 5,999,085 (Szwarc). This method does not lend itself to conventional resistor calibration equipment such as a laser or other cutting techniques that are typically used to reduce the width of the resistive element to increase the resistor's resistance value.

What is needed is an improved configuration and method of making a current sense resistor with TCR compensation or adjustment. It would also be desirable to provide an improved resistor configuration and method that simplifies TCR adjustment of current sense resistor during the manufacturing process. One or more of these aspects will become apparent from the specification and claims that follow.

SUMMARY

A resistor and a method of manufacturing a resistor with temperature coefficient of resistance (TCR) compensation are disclosed. The resistor has a resistive strip disposed between two conductive strips. A pair of main terminals and a pair of voltage sense terminals are formed in the conductive strips. A pair of rough TCR calibration slots is located between the main terminals and the voltage sense terminals, each of the rough TCR calibration slots have a depth selected to obtain a negative starting TCR value observed at the voltage sense terminals. A fine TCR calibration slot is formed between the pair of voltage sense terminals. The fine TCR calibration slot has a depth selected to obtain a TCR value observed at the voltage sense terminals that approaches zero. The resistor can also have a resistance calibration slot located between the pair of main terminals. The resistance calibration slot has a depth selected to calibrate a resistance value of the resistor.

DETAILED DESCRIPTION OF THE PREFERRED EMBODIMENTS

Figure 1:
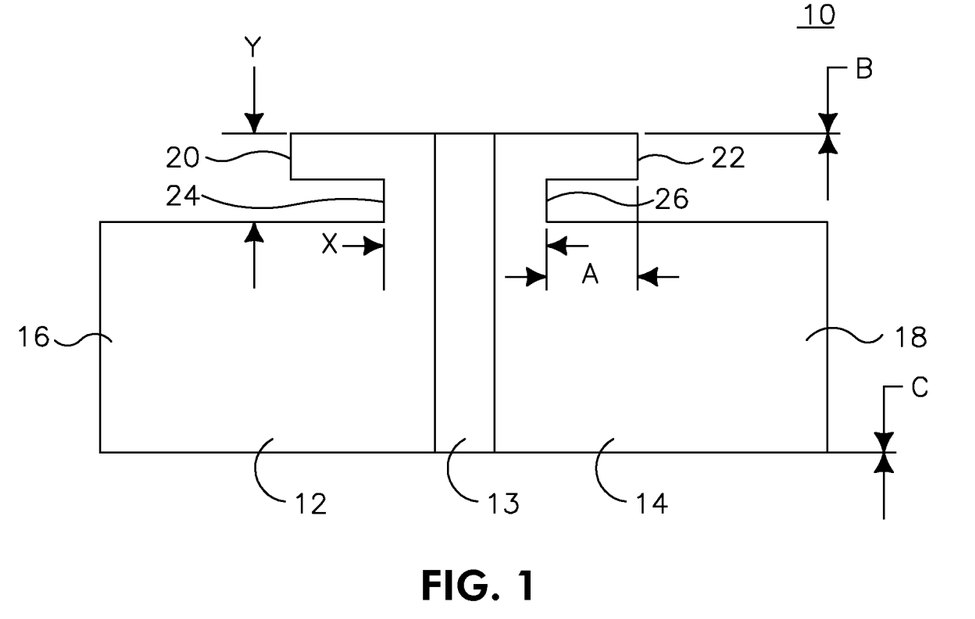
FIG. 1 illustrates a four terminal resistor with a pair of first slots configured to adjust TCR to a negative starting value.
Figure 2:
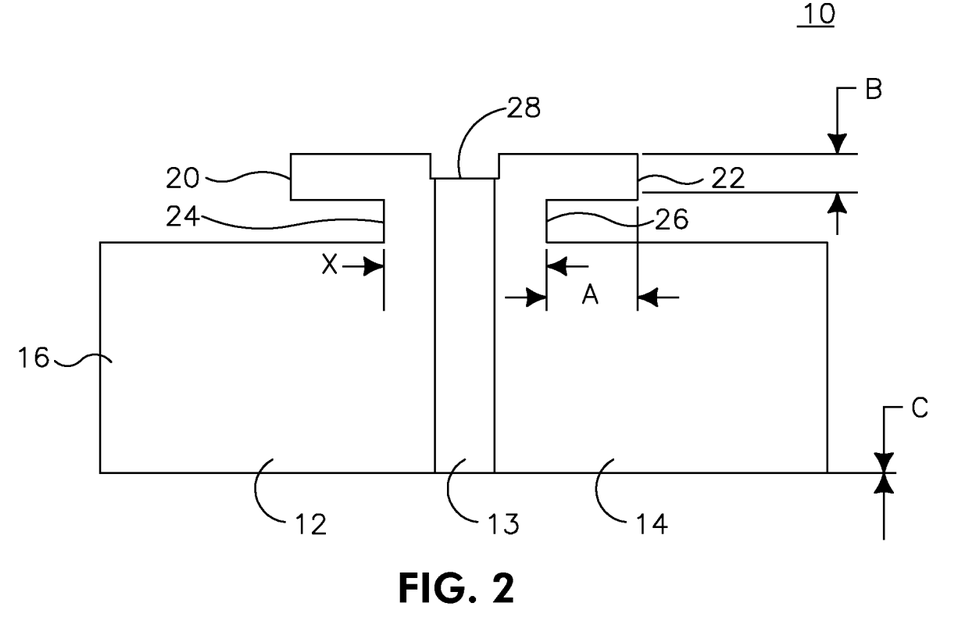
FIG. 2 illustrates a four terminal resistor with a pair of first slots and a second slot configured to collectively adjust TCR to a minimum value.
Figure 3:
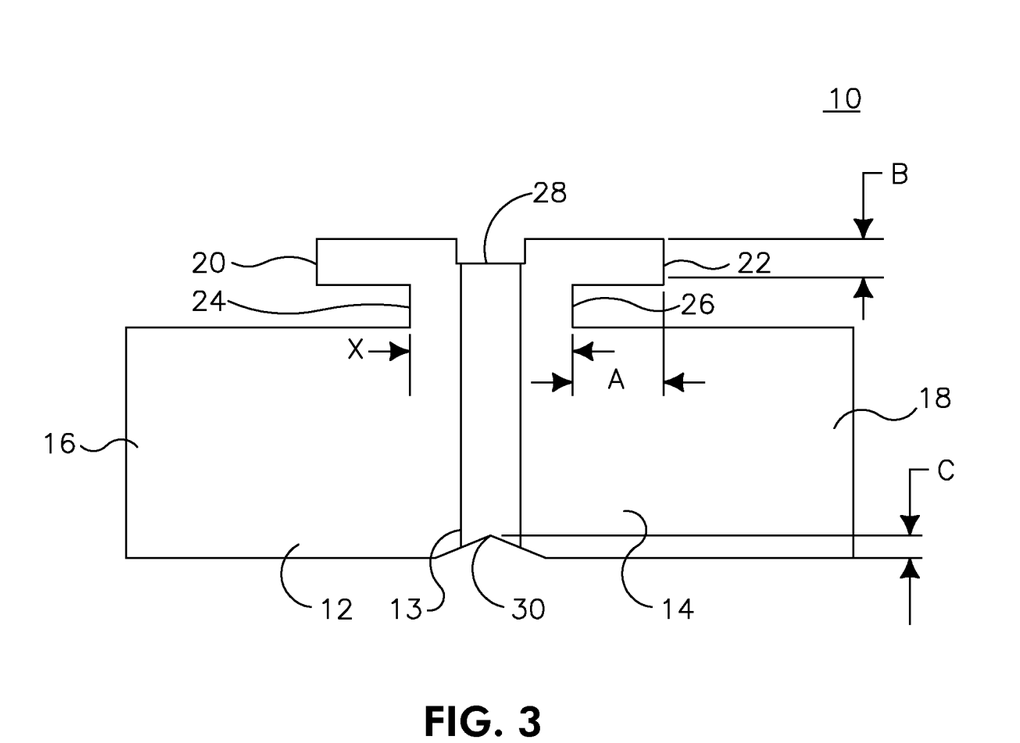
FIG. 3 illustrates a four terminal resistor with a pair of first slots and a second slot configured to collectively adjust TCR to a minimum value and a third slot configured for resistance calibration.

FIGS. 1-3 show exemplary resistor geometries through various stages of adjustment of the Temperature Coefficient of Resistance (TCR). It is understood that the techniques disclosed herein could also apply to other resistor types including film resistors, metal foil resistors and other types of resistor technologies.

FIG. 1, shows a resistor 10 generally formed of a resistive strip 13 disposed between two conductive strips 12, 14. The resistor 10 has main terminals 16, 18 and voltage sense terminals 20, 22. In operation, the main terminals 16, 18 carry the majority of the current passing through the resistor. A pair of first slots 24, 26 is located between the main terminals and the voltage sense terminals. First slots 24, 26 each have an associated depth that extends towards the resistive strip 13. This is shown generally as depth A. It is understood that each first slot 24, 26 can use the same depth A, or in the alternative, first slots 24 and 26 can have different depths. FIGS. 2 and 3 show the formation of a second slot having a depth B and a third slot having a depth C. The relationship between these slots will be discussed below.

Returning to FIG. 1, the conductive strips are generally formed of copper sheet material and have a thickness typically in the range of about 0.008-0.120 inches (~0.2-3 mm). The thickness of the copper is generally selected based on the desired power dissipation of the device and the desired mechanical strength (e.g., so that the resistor has sufficient strength during manufacture, installation and use).

The pair of first slots 24, 26 partition off a portion of the conductive strips 12, 14 and create a four terminal device. The size and location of the pair of first slots 24, 26 generally define the dimensions of the main terminals 16, 18 and the voltage sense terminals 20, 22. The pair of first slots 24, 26 is generally located towards one edge of the resistor. In this example, the pair of first slots 24, 26 are located a distance Y measured from the upper edge of the device. The Y distance is generally selected to yield appropriately sized voltage sense terminals. For example, the Y distance can be selected to provide voltage sense terminals of sufficient width to withstand punching or machining operations during manufacture and to have sufficient strength during installation and use.

The first slots 24, 26 each have a depth generally shown as distance A in FIG. 1. In most applications first slots 24, 26 will have the same depth A. It is understood that first slots 24 and 26 could each be associated with a different depth. It is also understood that the depth associated with first slots 24, 26 could be referenced from a variety of points on the device. Generally, the pair of first slots 24, 26 defines a reduced thickness or neck between the main terminals 16, 18 and the voltage sense terminals 20, 22. This is shown generally as the distance X in FIG. 1. A description of how the first slot depth A is determined is set out below.

In the following example, conductive strips 12, 14 are formed of copper. As noted above, copper has a TCR of 3900 ppm/° C. In contrast, the resistive strip 13 may have a TCR of less than 100 ppm/° C. In absence of the pair of first slots 24, 26, the resistor 10 would typically have a very high, positive TCR due to the large amount of copper disposed in the current path. It is generally desirable to minimize the TCR (i.e., a TCR having an absolute value approaching zero). A typical range for a given current sense resistor may be ±25 ppm/° C. Assume for this example that a given device has a target resistance value of 200μΩ (i.e., 0.0002Ω). Also assume that the initial design without the pair of first slots 24, 26 yields a device with a TCR of approximately 800 ppm/° C.

The thickness of the copper conductive strips 12, 14 is selected as discussed above. The dimensions of the resistive strip 13 are selected to yield a resistance that is close to but below the target resistance value. This is done because the final resistance value will be set by a subsequent trimming operation (which will increase the resistance value of the resistor).

Aside from defining the dimensions of the voltage sense terminals, the pair of first slots 24, 26 causes the TCR at the voltage sense terminals 20, 22 to become more negative. The deeper the pair of first slots 24, 26, the more negative the TCR at the voltage sense terminals 20, 22 becomes. The pair of first slots 24, 26 does not significantly alter the TCR of the resistor itself, rather the pair of first slots 24, 26 alter the TCR observed at the voltage sense terminals 20, 22.

Typically, the relationship between the first slot depth A, and the TCR observed at the voltage sense terminals 20, 22 is determined via a prototyping process. For example, a prototype device is manufactured and then tested using conventional methods (i.e., the voltage, current and temperature is measured through a range of conditions). The depth of the first slots 24, 26 is successively increased until a negative starting TCR value is observed at the voltage sense terminals 20, 22, for example approximately −200 ppm/° C. Thus, first and second slots 24, 26 can be thought of as rough TCR calibration slots.

A negative starting TCR value is desirable at this stage because a second slot will be used to fine tune the TCR value as discussed in more detail below. Once the proper first slot depth is determined, this depth is not altered for a particular style of product (i.e., resistors having the same physical and electrical characteristics). This is advantageous since the pair of first slots 24, 26 can be inserted early in the manufacturing process using conventional punching, end milling or other machining techniques. Subsequent slotting operations can be then carried out later in the manufacturing process and can even be accomplished via laser trimming.

Figure 4:
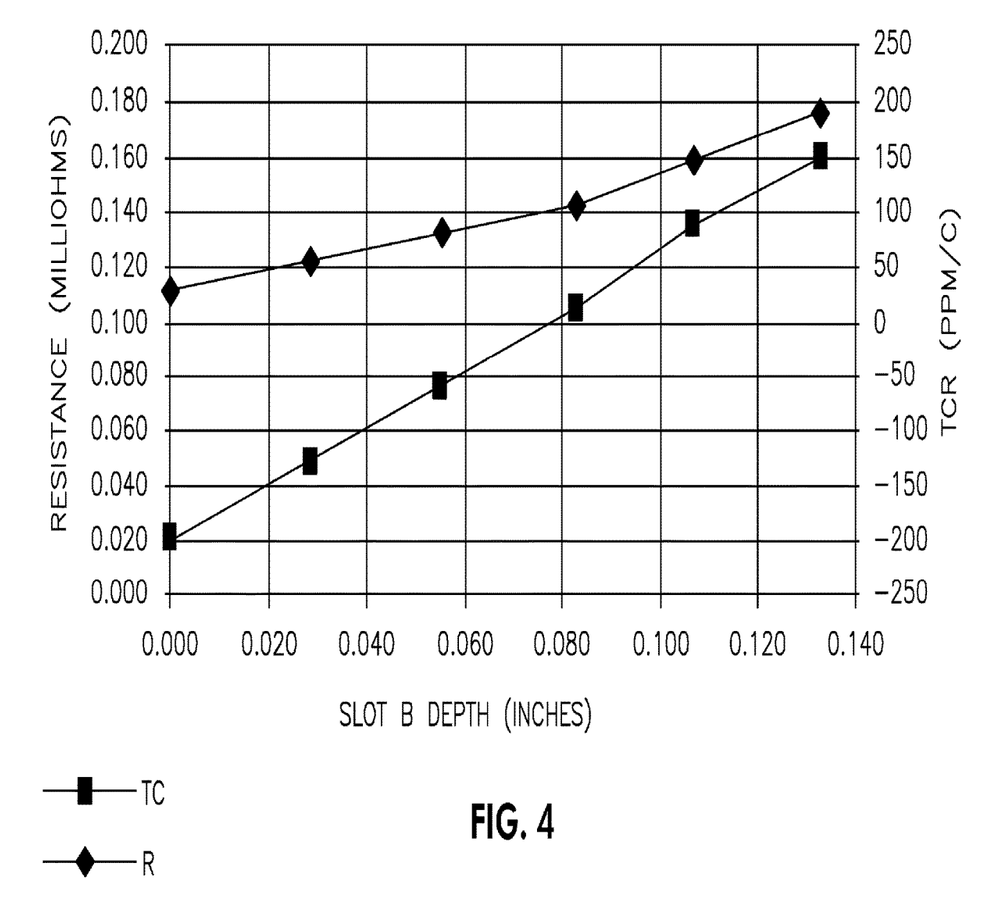
FIG. 4 is a graph showing the relationship between the second slot depth and TCR and resistance value.

Turning to FIG. 2, a second slot 28 having a depth B is shown located between the voltage sense terminals 20, 22. In general, the second slot 28 is formed in the resistive strip 13 between the voltage sense terminals 20, 22. It is understood that the second slot can also result in the removal of a portion of the voltage sense terminals 20, 22, as shown in FIG. 2. The net effect of the second slot 28 is to drive the TCR observed at the voltage sense terminals 20, 22 positive. The second slot 28 will also cause a small increase in resistance value. This is shown graphically in FIG. 4. In this example, the TCR of the resistor without a second slot 28 (e.g., as shown in FIG. 1) is −198 ppm/° C. The initial resistance of the device (without second slot 28) is approximately 110μΩ (i.e., 0.00011Ω). With the second slot depth set to 0.040" (~1 mm) the TCR improves to −100 ppm/° C. Similarly, the resistance increases to approximately 125μΩ (i.e., 0.000125Ω).

Turing to FIG. 3, with the second slot 28 set to at 0.080" (~2 mm) the TCR continues to become more positive and approaches zero. The resistance increases to approximately 140μΩ (i.e., 0.00014Ω). Thus, the second slot 28 functions as a fine TCR calibration slot. As noted above, a typical target range for TCR range for a given device would be approximately ±25 ppm/° C. The second slot 28 can be formed using laser trimming techniques, conventional punching, end milling or any other machining technique that will permit removal of material to a desired depth and width.

FIG. 3 also shows a third slot 30 (resistance calibration slot) formed between main terminals 16, 18. The third slot 30 has a depth that is selected to fine tune the resistor value. In this case the depth C is selected to yield a target resistance value within specified tolerance (e.g., 200μΩ±1%). The third slot 30 can be formed using laser trimming techniques, conventional punching, end milling or any other machining technique techniques that will permit removal of material to a desired depth and width.

It is understood that the first slots 24, 26 and the second slot 28 can be formed at the same time or at separate times. It is also understood that the second slot 28 can be changed "on the fly" (e.g., if TCR is measured on a resistor by resistor basis). Thus, the TCR of each resistor could be customized to a specified value. As an added advantage, the second slot 28 can be formed using laser trimming techniques which can greatly simplify the TCR adjustment process. First slots 24, 26 and second slot 28 shown in FIGS. 1 and 2 have a generally rectangular profile. Third slot 30 shown in FIG. 3 has a generally triangular profile. It should be understood that other simple or complex geometric slot profiles could be used without departing from the scope of this disclosure.

Figure 5:
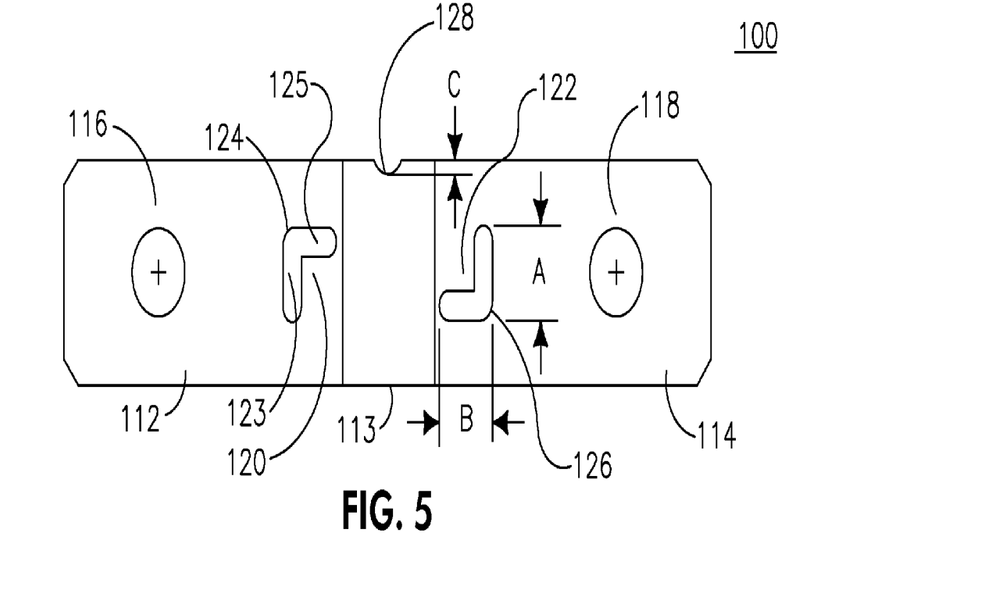
FIG. 5 illustrates another embodiment of a four terminal resistor with TCR compensation.

FIG. 5 shows another slot configuration for TCR compensation. FIG. 5 shows a resistor 100 generally formed of a resistive strip 113 disposed between two conductive strips 112, 114. The conductive strips are generally formed of copper sheet material and have a thickness typically in the range of about 0.008-0.120 inches (~0.2-3 mm). The thickness of the copper is generally selected based on the desired power dissipation of the device and the desired mechanical strength (e.g., so that the resistor has sufficient strength during manufacture, installation and use).

The resistor 100 has main terminals 116, 118 and voltage sense terminals 120, 122. In operation, the main terminals 116, 118 carry the majority of the current passing through the resistor. The main terminals are formed with a defined internal area (e.g., spaced away from the edges of the conductive strips 112, 114). A pair of first slots 124, 126 is located between the main terminals and the voltage sense terminals. In this embodiment the voltage sense terminals are formed within the defined internal area of the main terminals. This configuration is desirable for applications requiring more compact and centrally located voltage sense terminals. First slots 124, 126 are formed with two legs. First leg 123 has a length that extends generally orthogonal to the main current path as shown by "A." Second leg 125 has a length extends generally parallel to the main current path as shown by "B." It is understood that first slots 124 and 126 can use the same leg lengths A and B. In the alternative, first slots can have different leg lengths. The resistor 100 also has a second slot 128 having a depth C. The relationship between these slots will be discussed below.

The pair of first slots 124, 126 partition off an internal portion of the conductive strips 112, 114 and create a four terminal device. The size and location of the pair of first slots 124, 126 generally define the dimensions of the voltage sense terminals 120, 122. In this example, the sense terminals are located generally in the junction between the first and second legs 123, 125.

Figure 6:
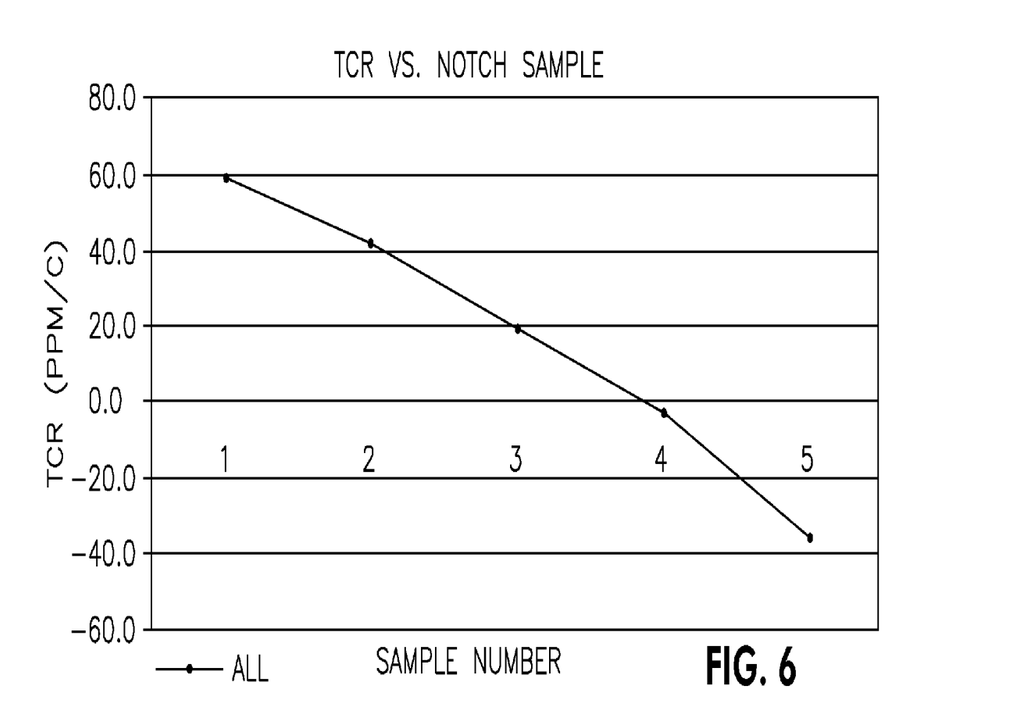
FIG. 6 is a graph showing the TCR compensation associated with the various slot formations.

As discussed above, the first leg 123 has a length A and the second leg 125 has a length B. FIG. 6 is a graph showing the TCR compensation associated with the formation of the first slots 124, 126. Sample 1 is a baseline resistor configured without first slots 124, 126. In this configuration, the TCR is +60 ppm/° C. Samples 2 and 3 show TCR compensation as the first legs 123 are added (Sample 2) and increased in length (Sample 3). As shown on the graph, the TCR becomes more negative ending at +20 ppm/° C. Samples 4 and 5 show TCR compensation as the second legs 125 are added (Sample 4) and increased in length (Sample 5). First legs 123 remain constant in samples 4 and 5. As shown on the graph, the TCR becomes more negative ending at approximately −35 ppm/° C.

During manufacturing, the first leg 123 can be inserted first until a rough level of TCR compensation is achieved. First legs can be formed by a variety of methods including punching or machining. The second leg 125 can be then inserted to fine tune the TCR compensation to the desired level, Second legs can be formed by a variety of methods including laser trimming. In most applications first slots 124, 126 will have the same dimensions. It is understood that first slots 124 and 126 could each be associated with other leg configurations. Once the first slots 124 and 126 are completed, second slot 128 can be formed to fine tune the resistance value. First slots 124, 126 and first and second legs 123, 125 as shown in FIG. 5 have a generally rectangular profile. Second slot 125 shown in FIG. 5 has a generally rounded profile. It should be understood that other simple or complex geometric slot or leg profiles could be used without departing from the scope of this disclosure.

Based on the foregoing it is readily apparent that a variety of modifications are possible without departing from the scope of the invention. For example the first slots 24, 26, 124, 126 can have varied spacing and depths. Similarly, variations in the location of the other slots and the shape of the various terminals are possible. Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. It is intended in the appended claims to cover all those changes and modifications which fall within the true spirit and scope of the present invention.

What is claimed is:

1. A resistor with temperature coefficient of resistance (TCR) compensation, the resistor comprising:
    a resistive strip disposed between a first conductive strip and a second conductive strip;
    a first voltage sense terminal and a first main terminal formed in the first conductive strip separated by a first slot at an outer edge of the first conductive strip;
    a second voltage sense terminal and a second main terminal formed in the second conductive strip separated by a second slot at an outer edge of the second conductive strip, the outer edge of the first conductive strip and the outer edge of the second conductive strip being on opposite sides of the resistor;
    a third slot formed at an edge of the resistive strip between the first and second voltage sense terminals; and,
    a fourth slot formed in the resistive strip between the first and second main terminals,
    wherein the first and second slots are configured to obtain a first TCR value observed at the first and second voltage sense terminals, wherein the third slot is configured to obtain a second TCR value observed at the first and second voltage sense terminals, and wherein the first TCR value and the second TCR value are different.

2. The resistor of claim 1, wherein the first slot has a depth that extends across the first conductive strip and the second slot has a depth that extends across the second conductive strip.

3. The resistor of claim 2, wherein the first slot has an opening at the outer edge of the first conductive strip opposite the resistive strip, and the second slot has an opening at the outer edge of the second conductive strip opposite the resistive strip.

4. The resistor of claim 1, wherein the fourth slot is formed at an edge of the resistive strip.

5. The resistor of claim 1, wherein the first voltage sense terminal and the first main terminal are formed contiguously in the first conductive strip, and wherein the second voltage sense terminal and the second main terminal are formed contiguously in the second conductive strip.

6. The resistor of claim 1, wherein the third slot does not meet either the first slot or the second slot.

7. The resistor of claim 1, wherein a depth of the first slot and the second slot adjust a TCR value of the resistor.

8. The resistor of claim 7, wherein a depth of the third slot adjusts a TCR value of the resistor.

9. The resistor of claim 1, wherein each of the first and second slots has a depth selected to obtain a negative starting TCR value observed at the first and second voltage sense terminals, and wherein the third slot has a depth selected to obtain a TCR value observed at the first and second voltage sense terminals that approaches zero.

10. The resistor of claim 1, wherein at least a portion of the third slot extends only between the first voltage sense terminal and the second voltage sense terminal.

11. A method of manufacturing a resistor with temperature coefficient of resistance (TCR) compensation, the method comprising:
   disposing a resistive strip between a first conductive strip and a second conductive strip;
   forming a first slot at an outer edge of the first conductive strip to form a first voltage sense terminal and a first main terminal in the first conductive strip;
   forming a second slot at an outer edge of the second conductive strip to form a second voltage sense terminal and a second main terminal in the second conductive strip, the outer edge of the first conductive strip and the outer edge of the second conductive strip being on opposite sides of the resistor;
   forming a third slot at an edge of the resistive strip between the first and second voltage sense terminals;
   forming a fourth slot in the resistive strip between the first and second main terminals;
   configuring the first and second slots to obtain a first TCR value observed at the first and second voltage sense terminals; and
   configuring the third slot to obtain a second TCR value observed at the first and second voltage sense terminals, wherein the first TCR value and the second TCR value are different.

12. The method of claim 11, wherein the first slot has a depth that extends across the first conductive strip and the second slot has a depth that extends across the second conductive strip.

13. The method of claim 12, wherein the first slot is formed having an opening at the outer edge of the first conductive strip opposite the resistive strip, and the second slot is formed having an opening at the outer edge of the second conductive strip opposite the resistive strip.

14. The method of claim 11, wherein the fourth slot is formed at an edge of the resistive strip.

15. The method of claim 11, wherein the first voltage sense terminal and the first main terminal are formed contiguously in the first conductive strip, and wherein the second voltage sense terminal and the second main terminal are formed contiguously in the second conductive strip.

16. The method of claim 11, wherein the third slot is formed such that it does not meet either the first slot or the second slot.

17. The method of claim 11, wherein a depth of the first slot and the second slot adjust a TCR value of the resistor.

18. The method of claim 17, wherein a depth of the third slot adjusts a TCR value of the resistor.

19. The method of claim 11, wherein each of the first and second slots has a depth selected to obtain a negative starting TCR value observed at the first and second voltage sense terminals, and wherein the third slot has a depth selected to obtain a TCR value observed at the first and second voltage sense terminals that approaches zero.

20. The method of claim 11, wherein the third slot is formed such that at least a portion of the third slot extends only between the first voltage sense terminal and the second voltage sense terminal.

\* \* \* \* \*